US00RE43626E

(19) United States
(12) Reissued Patent
Tain et al.

(10) Patent Number: US RE43,626 E
(45) Date of Reissued Patent: Sep. 4, 2012

(54) LED LAMP

(75) Inventors: Ra-Min Tain, Zhonghe (TW); Tzong-Che Ho, Hsinchu (TW); Shyi-Ching Liau, Qionglin Township (TW)

(73) Assignee: Transpacific IP I Ltd., Taipei (TW)

(21) Appl. No.: 12/859,141

(22) Filed: Aug. 18, 2010

Related U.S. Patent Documents

Reissue of:
(64) Patent No.: 7,413,326
Issued: Aug. 19, 2008
Appl. No.: 11/851,930
Filed: Sep. 7, 2007

U.S. Applications:
(63) Continuation of application No. 10/963,401, filed on Oct. 12, 2004, now Pat. No. 7,314,291.

(30) Foreign Application Priority Data

Jun. 30, 2004 (TW) ..... 93119800 A

(51) Int. Cl.
*F21V 29/00* (2006.01)
*H01L 29/22* (2006.01)

(52) U.S. Cl. ..... 362/294; 362/373

(58) Field of Classification Search ..... 362/294, 362/373
See application file for complete search history.

(56) References Cited

U.S. PATENT DOCUMENTS

| | | | | |
|---|---|---|---|---|
| 5,857,767 | A | 1/1999 | Hochstein | |
| 6,149,283 | A | 11/2000 | Conway et al. | |
| 6,220,722 | B1 | 4/2001 | Begemann | |
| 6,577,073 | B2 | 6/2003 | Shimizu et al. | |
| 6,617,616 | B2 | 9/2003 | Shibuya | |
| 6,663,248 | B2 | 12/2003 | Hsieh | |
| 6,864,513 | B2 | 3/2005 | Lin et al. | |
| 7,086,767 | B2 | 8/2006 | Sidwell et al. | |
| 7,097,317 | B2 | 8/2006 | Kim | |
| 7,144,135 | B2 | 12/2006 | Martin et al. | |
| 7,259,403 | B2 * | 8/2007 | Shimizu et al. | 257/99 |
| 7,314,291 | B2 | 1/2008 | Tain et al. | |
| 2006/0001384 | A1 | 1/2006 | Tain et al. | |

* cited by examiner

*Primary Examiner* — Stephen F Husar
*Assistant Examiner* — James Cranson, Jr.
(74) *Attorney, Agent, or Firm* — Knobbe, Martens, Olson & Bear LLP

(57) ABSTRACT

An LED lamp includes LED chips, an axle, and a lampshade. The LED chips are mounted on surface of the axle. The axle which is coupled to the lampshade includes heat pipes for transferring the heat generated by the LED chips to exterior of the lampshade and obtaining a better heat dissipation.

22 Claims, 8 Drawing Sheets

LED LAMP

Matter enclosed in heavy brackets [ ] appears in the original patent but forms no part of this reissue specification; matter printed in italics indicates the additions made by reissue.

CROSS REFERENCE TO RELATED APPLICATION

This is a continuation of parent application Ser. No. 10/963,401, filed Oct. 12, 2004 now U.S. Pat. No. 7,314,291. The entire disclosure of the parent application is incorporated herein by reference.

FIELD OF THE INVENTION

The invention generally relates to an LED lamp, and in particular relates to an LED lamp applying heat pipe for heat dissipation.

BACKGROUND OF THE INVENTION

Light emitting diode (LED) is a highly efficient device to transform electric energy into light in comparison to conventional incandescent bulbs. The most important part of an LED is the semi-conductor chip located in the center of the bulb. The LED chip has two regions separated by a junction. The p region is dominated by positive electric charges, and the n region is dominated by negative electric charges. The junction acts as a barrier to the flow of electrons between the p and the n regions. Only when sufficient voltage is applied to the semi-conductor chip, can the current flow, and the electrons cross the junction into the p region. When an electron moves sufficiently close to a positive charge in the p region, the two charges "re-combine". Each time an electron recombines with a positive charge, electric potential energy is converted into electromagnetic energy. For each recombination of a negative and a positive charge, a quantum of electromagnetic energy is emitted in the form of a photon of light.

LEDs have advantages of small size, low driving voltage, fast response, resistance to vibration and long service life. They do dozens of different jobs and are found in all kinds of devices. Among other things, they form the numbers on digital clocks, transmit information from remote controls, light up watches and tell you when your appliances are turned on. Collected together, they can form images on a jumbo television screen or illuminate a traffic light.

Common LED lamps usually can be divided into two kinds of monochromatic light and polychromatic light. The polychromatic light LED lamp usually includes several lamps being able to provide different colored lights under individual controls so as to perform blends of light change.

As shown in FIG. 1, a side view of an LED lamp unit disclosed in U.S. Pat. No. 6,577,073, a lamp unit 1000 mainly includes LED lamps 100, a reflector 110 and a power supply 120. The reflector 110 reflects the light produced from the LED lamps 100. The power supply 120 supplies power to the lamps 100. A number of, typically 10 to 200, LED lamps 100 are arranged on the bottom of the reflector 110 to provide the required luminosity. As shown in FIG. 2, each LED lamp includes blue and red LEDs and a phosphor. The blue LED produces an emission at a wavelength falling within a blue wavelength range. The red LED produces an emission at a wavelength falling within a red wavelength range. The phosphor is photoexcited by the emission of the blue LED to exhibit a luminescence having an emission spectrum in an intermediate wavelength range between the blue and red wavelength ranges.

In each LED lamp 100, the blue and red LEDs and the phosphor are integrated together within a single envelope. The lamp unit 1000 is composed of a plurality of such LED lamps. In comparison with prior arts that individual LED of monochromatic light being used, the LED lamp 100 of the prior patent saves about half of the space and cost of package.

However, in FIG. 1, the whole assembly of the plurality of LED lamps 100 in envelopes still occupies much area and decreases the number of possible LED lamps in the cluster and the luminosity of the lamp unit 1000 in the limited space.

There is further a problem that when arranging the LED lamps 100 tightly to get higher luminosity, the heat generated from the LED lamps is hard to be dissipated. The reflector 110 thermally coupled through solid conduction to the LED lamps 100 is insufficient for dissipating the heat. The heat accumulation will influence the service life of the lamp unit 1000.

SUMMARY OF THE INVENTION

In view of the aforesaid problems, the invention provides an LED lamp applicable to spotlight, headlight, house lamp, street lamp and so on. The LED lamp mainly includes a lampshade, an axle, LED chips, a driving circuit and a heat pipe.

The lampshade can be a bowl-shaped structure having a concave surface, a central hole and an opening. The surface can be used to reflect the light emitted from the LED chips. To achieve a better reflection, the surface is coated with a reflective film of suitable material.

The central hole is formed on bottom of the lampshade for receiving the axle and the heat pipe passing through. This heat pipe protrudes across both sides of the lampshade. A transparent plate is formed on the opening of the lampshade for enabling the light to pass through while preventing dust, insect or the like entering the lampshade and influencing the service life of the LED chips.

The material of the axle can be chosen from general printed circuit boards, ceramics or other electrically insulative while thermally conductive material. The heat pipe passes the central hole into the lampshade, and being defined with a heat receiving portion and a heat dissipation portion. The heat receiving portion is covered by the lampshade where the LED chips emit light and heat.

Several LED chips are mounted on surface of the axle and corresponding to the heat receiving portion of the heat pipe, including the exterior axial surface of the axle and the end surface facing the transparent plate. The color, number and arrangement of the LED chips can be designed by user for achieving specific light effects.

The characteristics of the invention are that the LED chips can be bare chips without packages as prior arts. Therefore, the quantity of LED chips capable of being arranged in the limited area can be increased so as to increase the luminosity. Meanwhile, the cost and time of packaging the LED chips individually are also saved.

The driving circuit is embedded in the axle for actuating the LED chips individually, controlling the brightness and color blending of the LED lamp, and preventing static electricity to damage the LED chips. The LED chips are electrically connected to the driving circuit through embedding, wire bonding or other methods.

The heat pipe is installed along the axle for dissipating the heat generated by the LED chips from the heat receiving portion to the heat dissipation portion. The heat pipe is able to transport heat by an evaporation-condensation cycle with the help of porous capillaries. It dissipates the heat at the heat dissipation portion via natural convection or additional cooling fan, and solves the problem of heat accumulation in the LED chips.

BRIEF DESCRIPTION OF THE DRAWINGS

The invention will become more fully understood from the detailed description given hereinbelow. However, this description is for purposes of illustration only, and thus is not limitative of the invention, wherein.

DETAILED DESCRIPTION OF THE INVENTION

Figure 1:
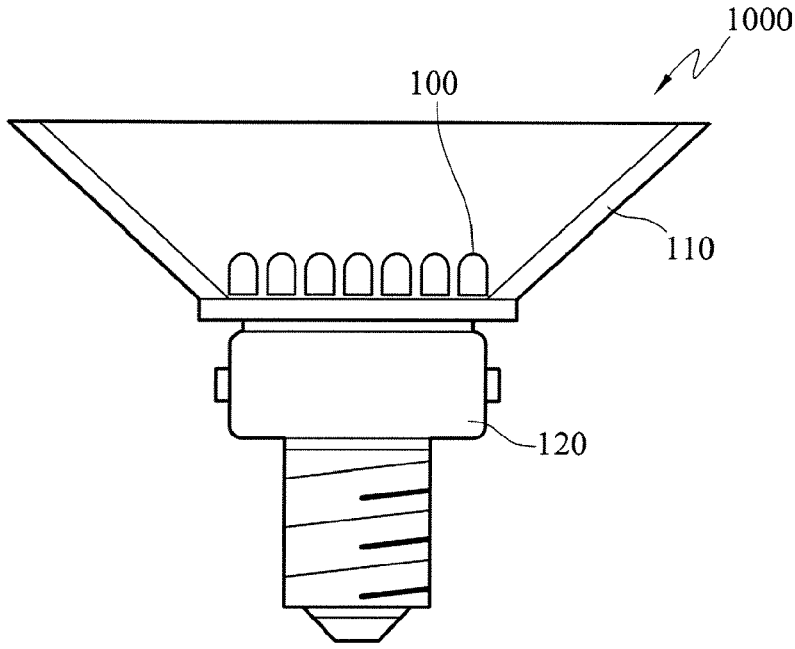
FIG. 1(PRIOR ART)
FIG. 1 is a side view of an LED lamp unit disclosed in U.S. Pat. No. 6,577,073.
Figure 2:
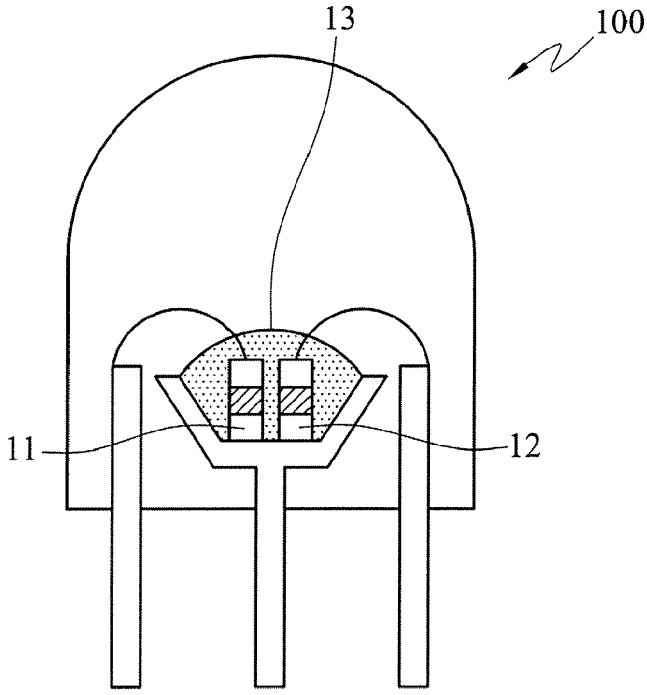
FIG. 2(PRIOR ART)
FIG. 2 is a side view of an LED lamp used in a lamp unit of U.S. Pat. No. 6,577,073.
Figure 3A:
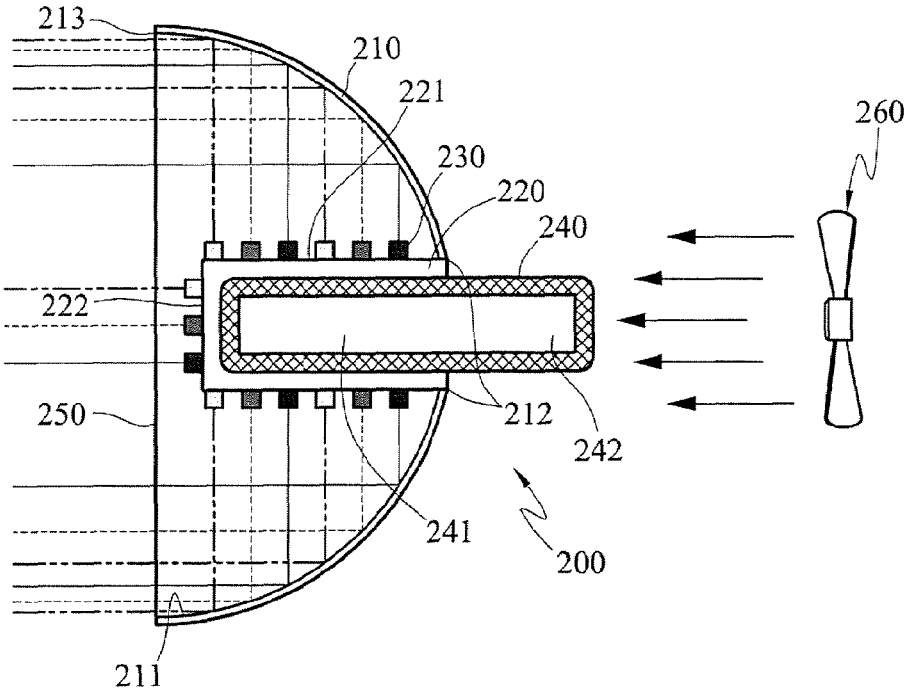
FIGS. 3A and 3B are side view and front view of an LED lamp of a first embodiment of the invention.
Figure 3B:
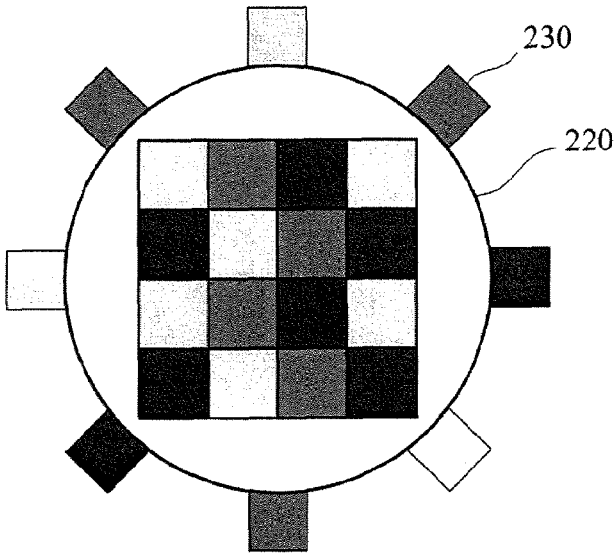

As shown in FIGS. 3A and 3B, a side view and a front view of an LED lamp in a first embodiment of the invention, the LED lamp 200 mainly includes a lampshade 210, an axle 220, LED chips 230, a driving circuit (not shown) and a heat pipe 240.

The lampshade 210 is a bowl-shaped construction having a concave surface 211, a central hole 212 and an opening 213. The concave surface 211 is used to reflect the light emitted from the LED chips 230 toward the opening 213 of the lampshade 210. To achieve a better reflection, the surface 211 is coated with a reflective film of suitable material or has been polished to reflect light. The central hole 212 is formed on bottom of the lampshade 210 for receiving the axle 220 and the heat pipe 240 passing through.

A transparent plate 250 is mounted on the opening 213 of the lampshade 210 for enabling the light emitted from the LED chips 230 to pass through while preventing dust, insect or the like entering the lampshade 210 and influencing the service life of the LED chips 230. The transparent plate 250 can also be processed with diffusion patterns, light-enhancing film, polarization film and so on for achieving different light effects.

Figure 4:
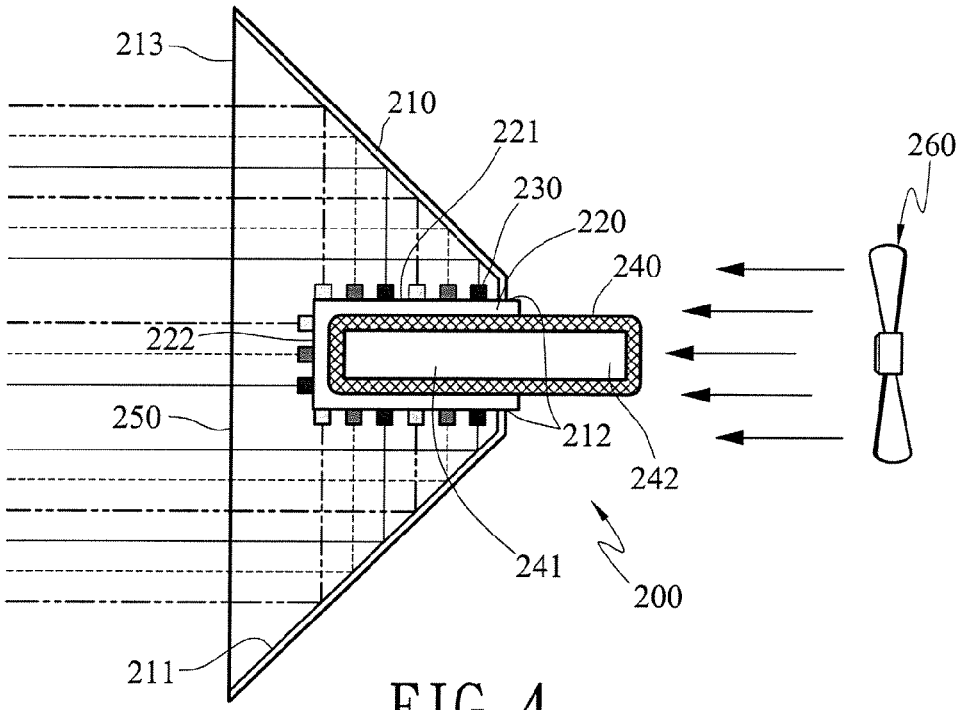
FIG. 4 is a sectional view of a pyramid lampshade in an LED lamp of the invention.

The shape of the lampshade 210 is not limited to spherical but also be a pyramid as shown in FIG. 4, or other concave shapes.

The axle 220 passes the central hole 212 and extrudes into the lampshade 210. The material of the axle 220 can be chosen from general printed circuit boards, ceramics or other electrically insulative while thermally conductive material.

The heat pipe 240 passes the central hole into the lampshade 210 and being defined with a heat receiving portion 241 (at the left side of the drawing) and a heat dissipation portion 242 (at the right side of drawing). The heat receiving portion 241 is covered by the lampshade 210 where the LED chips 230 emit light and heat.

Several LED chips 230 are mounted on surface of the axle 220 and corresponding to the heat receiving portion 241 of the heat pipe 240, including the exterior axial surface 221 of the axle 220 and the end surface 222 facing the transparent plate 250.

The driving circuit (not shown in the drawing) is embedded in the axle 220 for activating the LED chips 230 individually, controlling the brightness and color blending of the LED lamp 200, and preventing static electricity to damage the LED chips 230. The LED chips 230 are electrically connected to the driving circuit through embedding, wire bonding or other methods.

When using printed circuit board to make the axle 220, the driving circuit can be made with stacks inside the axle 220, or printed on surface of the axle 220. When the axle 220 is not made by printed circuit board, the surface of the axle 220 can be covered with a printed circuit to achieve the same function.

In order to prevent oxidization of the LED chips 230 caused by direct exposure to the air, the space enclosed by the lampshade 210 and the transparent plate 250 can be filled with nitrogen or other inert gas. Or, the surface of the LED chips 230 is coated with a transparent material, such as epoxy or silicone. Another method is to vacuum the space enclosed by the lampshade 210 and the transparent plate 250 and to prevent the LED chips 230 from reaction with air.

The characteristics of the invention are that the LED chips 230 are bare chips without packages as prior arts. Therefore, the quantity of LED chips 230 capable of being arranged in the limited area can be increased so as to increase the luminosity. Meanwhile, the cost and time of packaging the LED chips 230 individually are also saved so as to improve the manufacturing efficiency of the LED lamp 200.

The LED chips 230 mounted on the axle 220 can be of monochromic light or polychromatic light. When using LED chips 230 of different colors, the different color LED chips 230 (for example of red, blue and green lights) are interposed so that the adjacent LED chips 230 can be controlled to provide different colors of light for different light effects of the LED lamp 200.

The heat pipe 240 is installed along the axle 220 for dissipating the heat generated by the LED chips 230 from the heat receiving portion 241 to the heat dissipation portion 242. The heat pipe 240 is able to transport heat by an evaporation-condensation cycle with the help of porous capillaries. It dissipates the heat at the heat dissipation portion 242 via natural convection or an additional cooling fan 260, and solves the problem of heat accumulation in the LED chips 230.

The heat pipe 240 works with liquid and gas phase transitions of a working fluid sealed inside the heat pipe. It has a thermal conductibility dozens of times to that of copper. Therefore, the heat applied to the heat receiving portion 241 of the heat pipe 240 is fast transferred to the heat dissipation portion 242.

Figure 5:
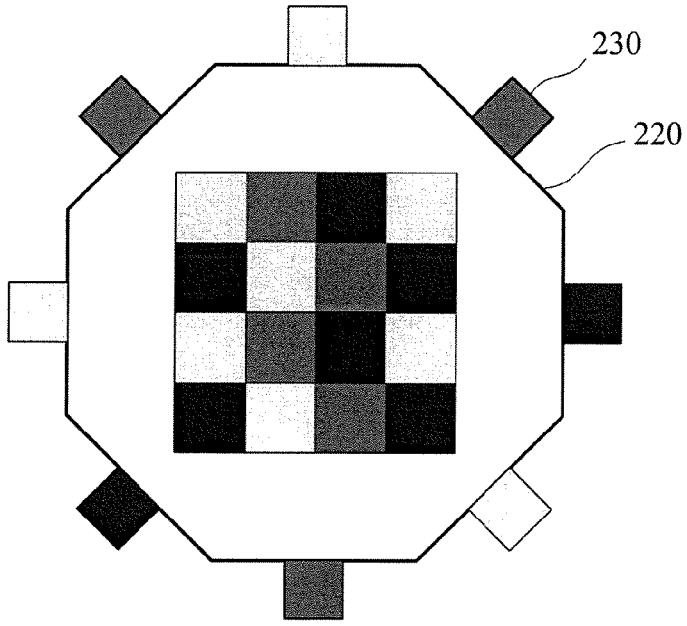
FIG. 5 is a front view of a polygon axle in an LED lamp of the invention.

The section of the axle 220 is not limited to circular as shown in FIG. 3B, but can also be polygons as shown in FIG. 5, or any other suitable shape.

Figure 6:
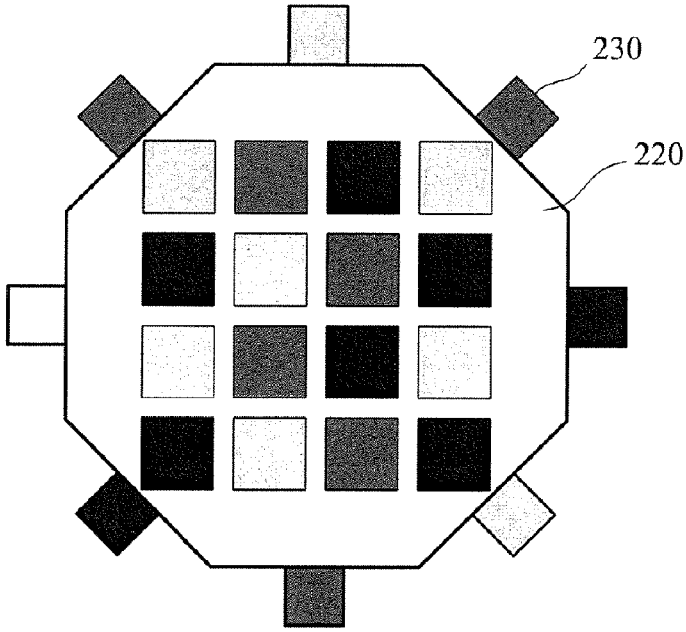
FIG. 6 is a front view of an axle where LED chips are dispersedly arranged.

The arrangement of the LED chips 230 on the axle 220 can be tight as shown in FIG. 3B, or be dispersed as shown in FIG. 6 for different light effects.

Figure 7:
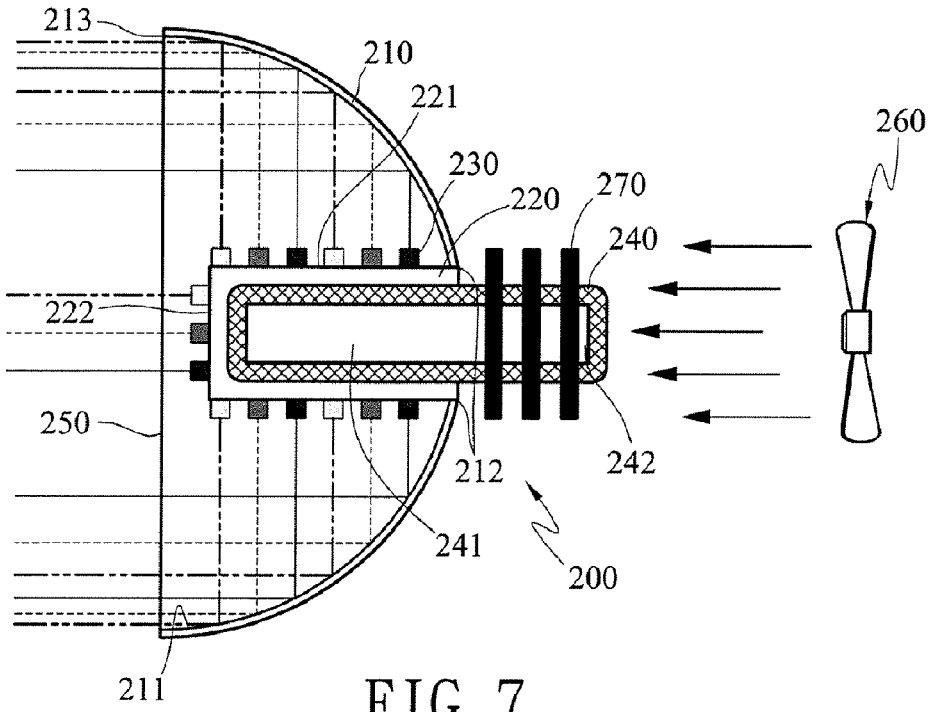
FIG. 7 is a side view of an LED lamp of a second embodiment of the invention.

Now referring to FIG. 7, a second embodiment of the invention, the LED lamp is similar to the first embodiment but having radiation fins 270 mounted on the end of heat pipe 240 for dissipating the heat transferred to the heat dissipating portion 242. In accompany with an additional fan 260 to expel airflow, higher efficiency heat dissipation is achieved.

The LED chips 230 can be of monochromic light or polychromatic light. When using LED chips 230 of different colors, the different color LED chips 230 (for example of red, blue and green lights) are interposed so that the adjacent LED chips 230 can be controlled to provide different colors of light for different light effects of the LED lamp. The arrangement of the LED chips can be tight or dispersed.

Figure 8:
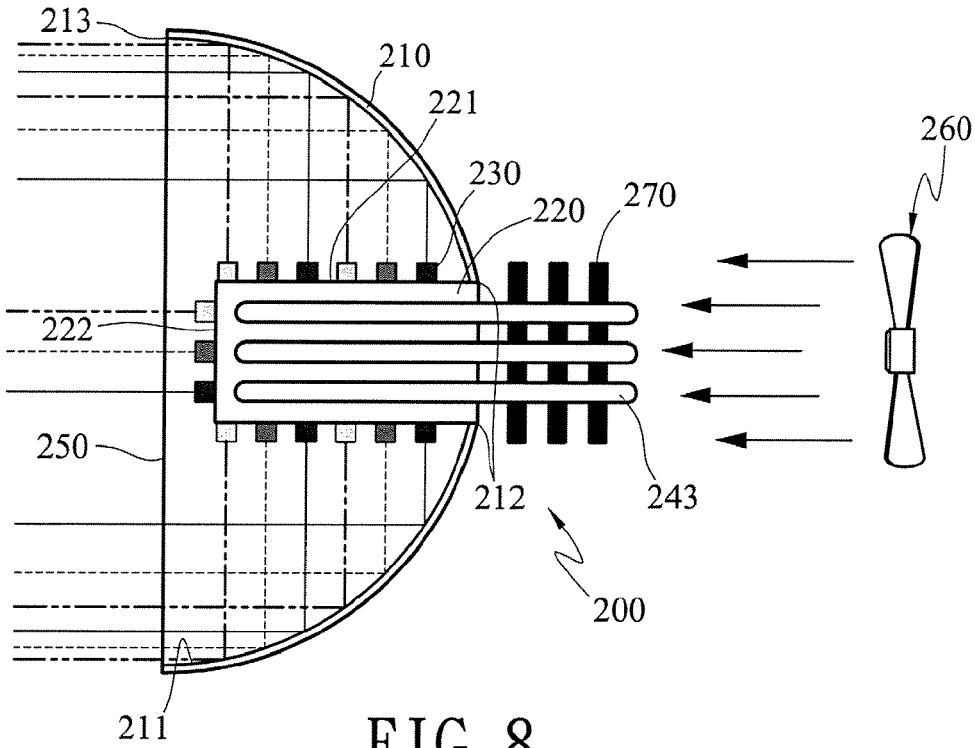
FIG. 8 is a side view of an LED lamp of a third embodiment of the invention.

As shown in FIG. 8, the heat pipe 240 is replaced with several heat pipes 243 of smaller dimensions to get the same function.

Figure 9:
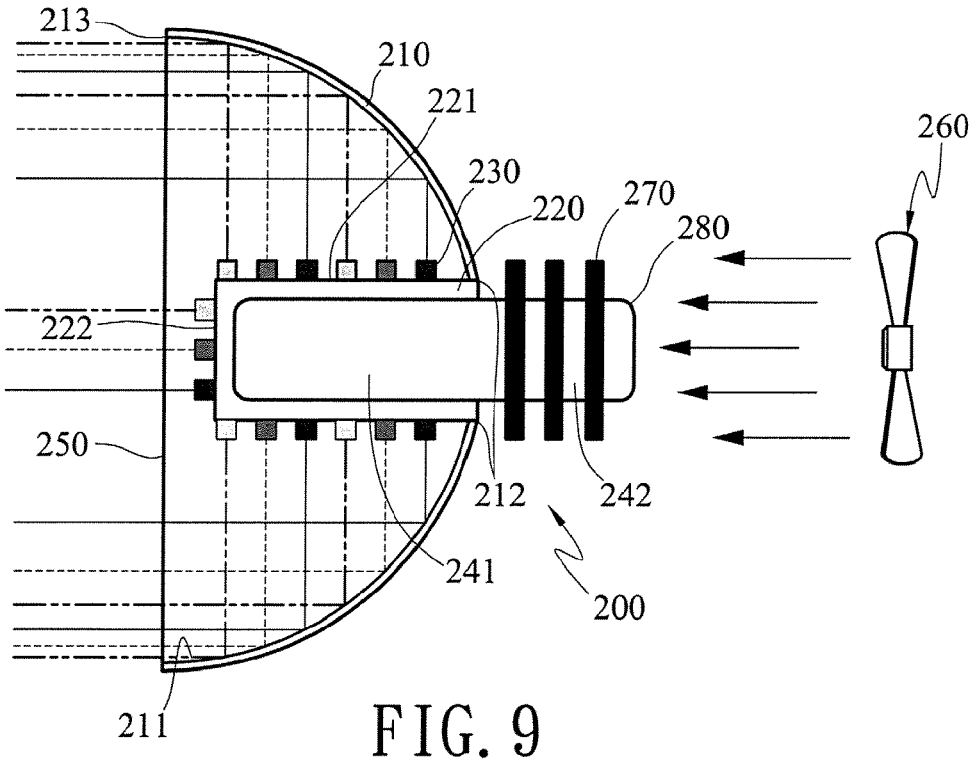
FIG. 9 is a side view of an LED lamp of a fourth embodiment of the invention.

FIG. 9 is a side view of an LED lamp of a fourth embodiment of the invention. The LED lamp is similar to the first embodiment but the heat pipe 240 of FIG. 3 being replaced with a thermally conductive rod (such as a copper rod) 280 for dissipating the heat transferred from the heat receiving portion 241 to the heat dissipating portion 242. Similarly, several radiations fins 270 can be mounted on the end of the rod 280 to obtain higher efficiency heat dissipation.

The LED chips 230 can be of monochromic light or polychromatic light. When using LED chips 230 of different colors, the different color LED chips 230 (for example of red, blue and green lights) are interposed so that the adjacent LED chips 230 can be controlled to provide different colors of light for different light effects of the LED lamp. The arrangement of the LED chips can be tight or dispersed.

Figure 10:
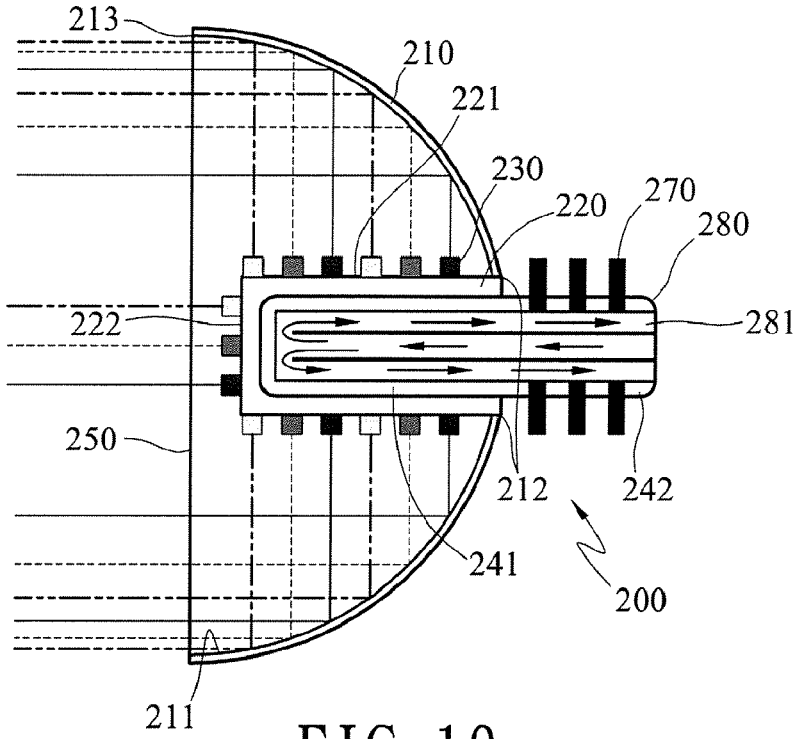
FIG. 10 is a side view of an LED lamp of a fifth embodiment of the invention.

FIG. 10 is a side view of an LED lamp of a fifth embodiment of the invention. The LED lamp is similar to the fourth embodiment but having a plurality of small passages formed in parallel in the thermally conductive rod 280 and allowing fluid to flow inside of the passages for heat transfer purpose. The fluid can be gas or liquid for transferring the heat from the heat receiving portion 241 to the heat dissipating portion 242.

The LED chips 230 can be of monochromic light or polychromatic light. When using LED chips 230 of different colors, the different color LED chips 230 (for example of red, blue and green lights) are interposed so that the adjacent LED chips 230 can be controlled to provide different colors of light for different light effects of the LED lamp. The arrangement of the LED chips can be tight or dispersed.

Figure 11:
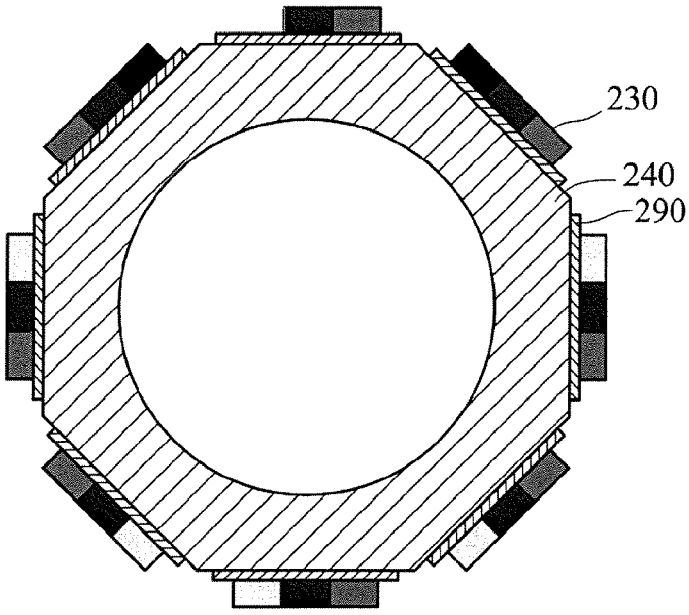
FIG. 11 is a front view of an LED lamp of a sixth embodiment of the invention.

FIG. 11 is a front view of an LED lamp of a sixth embodiment of the invention. The LED lamp 200 is simplified from the first embodiment. An insulation layer 290 is formed outside the heat pipe 240 for the LED chips 230 to be mounted on. The arrangement of the LED chips can be tight or dispersed.

The LED chips 230 can be of monochromic light or polychromatic light. When using LED chips 230 of different colors, the different color LED chips 230 (for example of red, blue and green lights) are interposed so that the adjacent LED chips 230 can be controlled to provide different colors of light for different light effects of the LED lamp. The arrangement of the LED chips can be tight or dispersed.

Figure 12A:
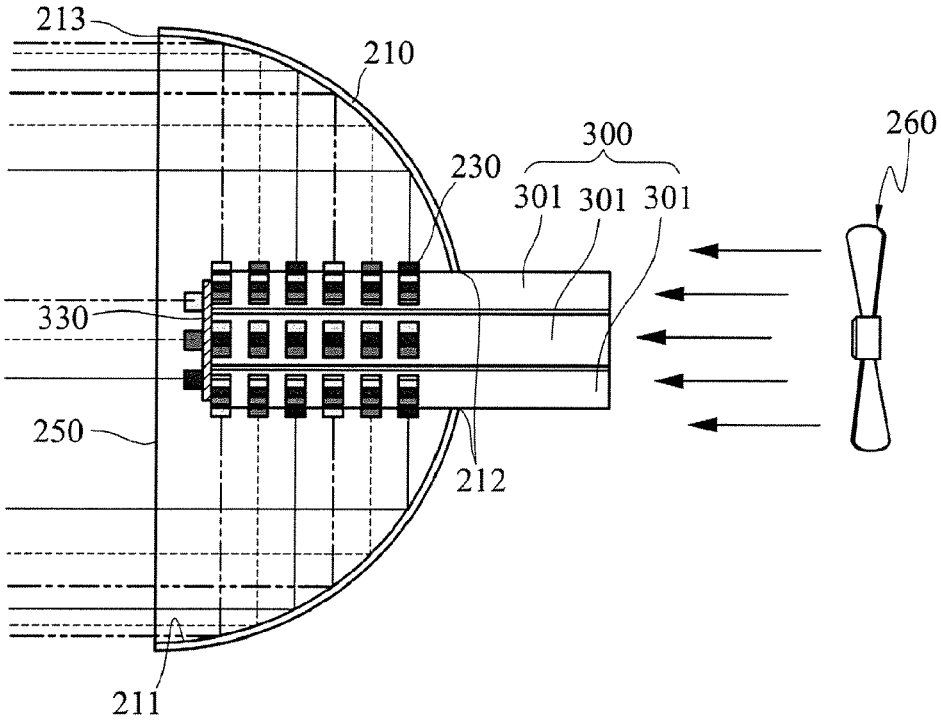
FIGS. 12A and 12B are side view and front view of an LED lamp of a seventh embodiment of the invention.
Figure 12B:
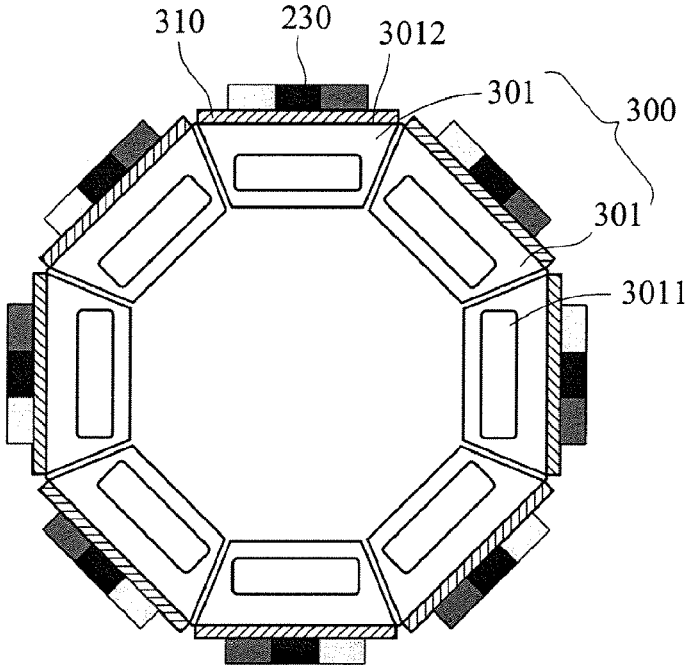

FIGS. 12A and 12B are side view and front view of an LED lamp of a seventh embodiment of the invention. The axle 300 has a different construction from the aforesaid embodiments. The axle 300 is composed of eight heat pipes 301 each having a trapezoid section so as to form the axle 300 an octagon section with a hollow core. An end plate 330 is mounted on front end of the axle 300 and facing the transparent cover 250.

Figure 13:
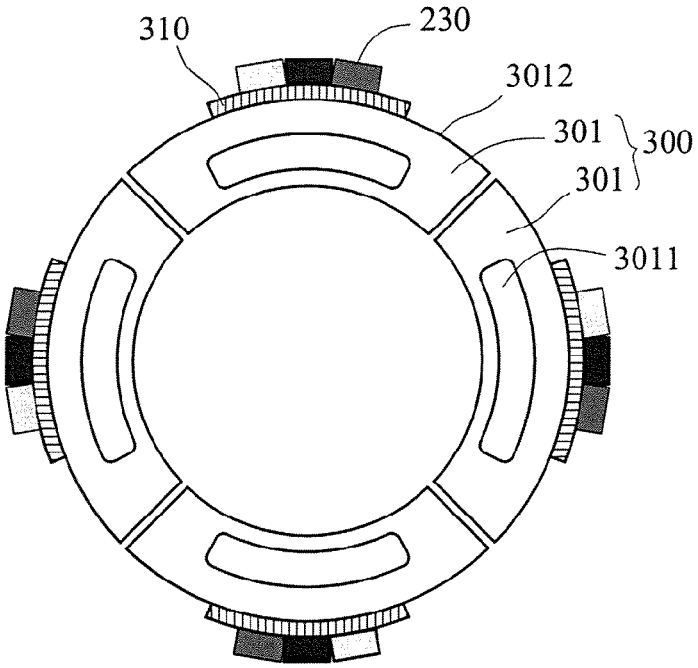
FIG. 13 is a front view of four quarters of circular heat pipes of an LED lamp of the invention.

Of course, the heat pipes 301 of the axle 300 are not limited to the octagon section. They can be of quarters of a circle as shown in FIG. 13, or other sections to form an axle 300 with circular, hexagon or other polygon sections.

A fluid conduit 3011 is formed inside each heat pipe 301 for performing liquid and gas phase cycles and removing the heat from the LED chips 230. The exterior surface 3012 of each heat pipe 301 is covered with a layer of printed circuit board 310. The driving circuit (not shown in the drawing) is stacked in the printed circuit board 310, or printed on surface of the printed circuit board 310.

Further, the printed circuit board 310 on exterior surface 3012 of the heat pipe 301 can be replaced with an insulation layer, such as an oxide or ceramic material to get the same insulation function. Then, forming the driving circuit inside or on surface of the insulation layer.

Figure 14:
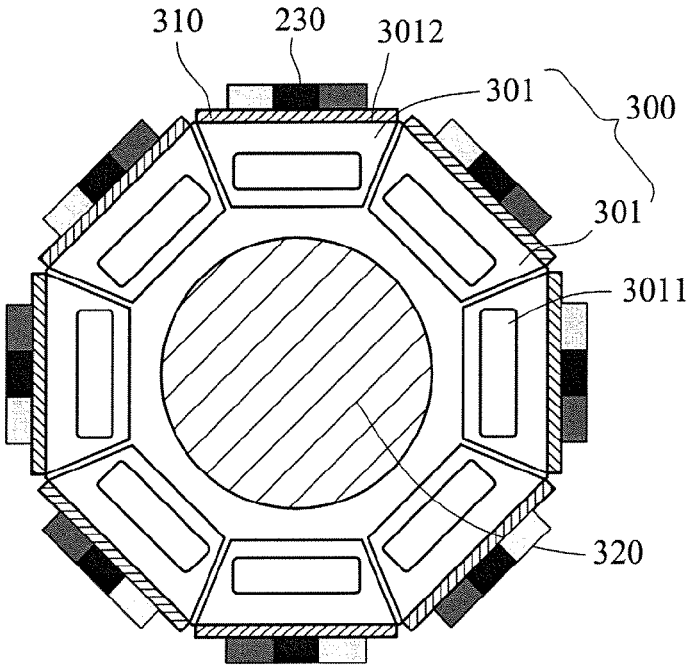
FIG. 14 is a sectional front view of an axle that includes a core.

The axle 300 passes the central hole 212 and extrudes into the lampshade 210. Each heat pipe 301 passes the central hole 212 into the lampshade 210, and being defined with a heat receiving portion 302 and a heat dissipation portion 303. As shown in FIG. 14, a rod 320 is inserted into the axle 300 for improving the stiffness of the axle 300.

The LED chips 230 are mounted on the exterior surface 3012 of the heat pipes 301 and the end plate 330. The LED chips 230 can be of monochromic light or polychromatic light. When using LED chips 230 of different colors, the different color LED chips 230 (for example of red, blue and green lights) are interposed so that the adjacent LED chips 230 can be controlled to provide different colors of light for different light effects of the LED lamp. The arrangement of the LED chips can be tight or dispersed.

The heat generated by the LED chips 230 is transferred from the heat receiving portion 302 to the heat dissipating portion 303 by means of thermal conduction of each heat pipe 301. The heat transferred to the heat dissipation portion 242 is then dissipated by natural convection or an additional cooling fan 260. It solves the problem of heat accumulation in the exterior surface 3012 of the heat pipe 301.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An LED lamp, comprising:

a lampshade having a concave surface, at least a hole and an opening said hole being formed on said lampshade;

an axle including a plurality of heat pipes, each one of said heat pipes having a heat receiving portion being coupled to said lampshade and a heat dissipating portion being disposed outside of said lampshade; and a plurality of LED chips, mounted on surface of said heat receiving portion of said heat pipes;

wherein said plurality of LED chips and said heat pipes are arranged with respect to each other so that heat generated by said LED chips is transferred by said heat pipes from said heat receiving portion to said heat dissipating portion.

2. The LED lamp according to claim 1, wherein surface of said LED chips are covered with a transparent material for preventing said LED chips from reaction with air.

3. The LED lamp according to claim 2, wherein said transparent material is chosen from one of epoxy and silicone.

4. The LED lamp according to claim 1, further comprising a transparent plate mounted on said opening of said lampshade for preventing foreign objects entering said lampshade.

5. The LED lamp according to claim 4, wherein a space enclosed by said transparent plate and said lampshade is filled with a transparent material for preventing said LED chips from reaction with air.

6. The LED lamp according to claim 5, wherein said transparent material is chosen from one of nitrogen and inert gas.

7. The LED lamp according to claim 5, wherein said transparent material is chosen from one of epoxy and silicone.

8. The LED lamp according to claim 4, wherein a space enclosed by said transparent plate and said lampshade is vacuumed for preventing said LED chips from reaction with air.

9. The LED lamp according to claim 1, wherein an end of said axle is covered with an end plate for mounting LED chips.

10. The LED lamp according to claim 1, wherein each heat pipe has a trapezoid section for forming said axle with a polygon section.

11. The LED lamp according to claim 1, wherein each exterior surface of said heat pipe is covered by a printed circuit board.

12. The LED lamp according to claim 1, further comprising an electrically insulation layer covering exterior surface of said heat pipes.

13. The LED lamp according to claim 1, wherein said LED chips are bare chips.

14. The LED lamp according to claim 1, wherein said LED chips emit light of different colors or the same color.

15. The LED lamp according to claim 1, wherein said axle further comprises a rod for enhancing stiffness.

16. The LED lamp according to claim 1, further comprising at least a radiation fin mounted on said heat dissipating portion of said axle.

17. The LED lamp according to claim 1, wherein said heat pipes pass through said hole into said lampshade, extend across both sides of said lampshade and is defined with said heat receiving portion and said heat dissipating portion.

18. The LED lamp according to claim 1, wherein said heat receiving portion is disposed inside of said lampshade.

*19. An LED lamp, comprising:*

*a lampshade having a reflective surface and a hole formed therein;*

*an axle extending through the hole and including one or more heat transfer members, wherein each one of the heat transfer members has a heat receiving portion coupled to the lampshade and a heat dissipating portion located outside of the lampshade; and*

*a plurality of LED chips mounted on the heat receiving portions of the one or more heat transfer members;*

*wherein the plurality of LED chips and the one or more heat transfer members are arranged with respect to each other such that heat, generated by the LED chips is transferred by the one or more heat transfer members from the heat receiving portions to the heat dissipating portions.*

*20. The LED lamp of claim 19, wherein the reflective surface has a concave-shaped sectional side profile.*

*21. The LED lamp of claim 19, wherein the reflective surface has a pyramid-shaped sectional side profile.*

*22. The LED lamp of claim 19, wherein the one or more heat transfer members comprises one or more heat pipes.*

* * * * *

UNITED STATES PATENT AND TRADEMARK OFFICE

CERTIFICATE OF CORRECTION

PATENT NO. : RE43,626 E
APPLICATION NO. : 12/859141
DATED : September 4, 2012
INVENTOR(S) : Tain et al.

It is certified that error appears in the above-identified patent and that said Letters Patent is hereby corrected as shown below:

In Column 6, Line 53, in Claim 1, delete “opening” and insert -- opening, --, therefor.

Signed and Sealed this
Twelfth Day of February, 2013

Teresa Stanek Rea
*Acting Director of the United States Patent and Trademark Office*